(12) United States Patent
Hayashi et al.

(10) Patent No.: US 11,410,847 B2
(45) Date of Patent: Aug. 9, 2022

(54) FILM FORMING METHOD AND FILM FORMING APPARATUS

(71) Applicant: TOKYO ELECTRON LIMITED, Tokyo (JP)

(72) Inventors: Hiroyuki Hayashi, Nirasaki (JP); Sena Fujita, Nirasaki (JP); Keita Kumagai, Nirasaki (JP); Keisuke Fujita, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 86 days.

(21) Appl. No.: 16/830,835

(22) Filed: Mar. 26, 2020

(65) Prior Publication Data
US 2020/0312661 A1  Oct. 1, 2020

(30) Foreign Application Priority Data
Mar. 28, 2019 (JP) .............................. JP2019-064843

(51) Int. Cl.
H01L 21/02 (2006.01)
C23C 16/40 (2006.01)
C23C 16/46 (2006.01)
C23C 16/455 (2006.01)

(52) U.S. Cl.
CPC ...... *H01L 21/02645* (2013.01); *C23C 16/402* (2013.01); *C23C 16/455* (2013.01); *C23C 16/46* (2013.01); *H01L 21/0243* (2013.01); *H01L 21/0262* (2013.01); *H01L 21/02381* (2013.01); *H01L 21/02488* (2013.01); *H01L 21/02532* (2013.01); *H01L 21/02592* (2013.01)

(58) Field of Classification Search
CPC ......... C23C 16/52; C23C 16/56; C23C 16/24; C23C 16/0272; C23C 16/4408; H01L 27/124; H01L 27/1248; H01L 27/1255; H01L 27/1259; H01L 27/3276
See application file for complete search history.

(56) References Cited

U.S. PATENT DOCUMENTS

2017/0243742 A1 * 8/2017 Takahashi ............. C23C 16/455

FOREIGN PATENT DOCUMENTS

JP 2017-152426 A 8/2017

* cited by examiner

*Primary Examiner* — Tony Tran
(74) *Attorney, Agent, or Firm* — Nath, Goldberg & Meyer; Jerald L. Meyer; Tanya E. Harkins

(57) ABSTRACT

There is provided a film forming method including: supplying a halogen-free silicon raw material gas and a halogen-containing silicon raw material gas into a processing container while lowering a temperature of a substrate accommodated in the processing container from a first temperature to a second temperature in a temperature lowering process; and supplying the halogen-free silicon raw material gas and the halogen-containing silicon raw material gas into the processing container while maintaining the temperature of the substrate at a third temperature in a temperature stabilizing process, that occurs after the temperature lowering process.

9 Claims, 6 Drawing Sheets

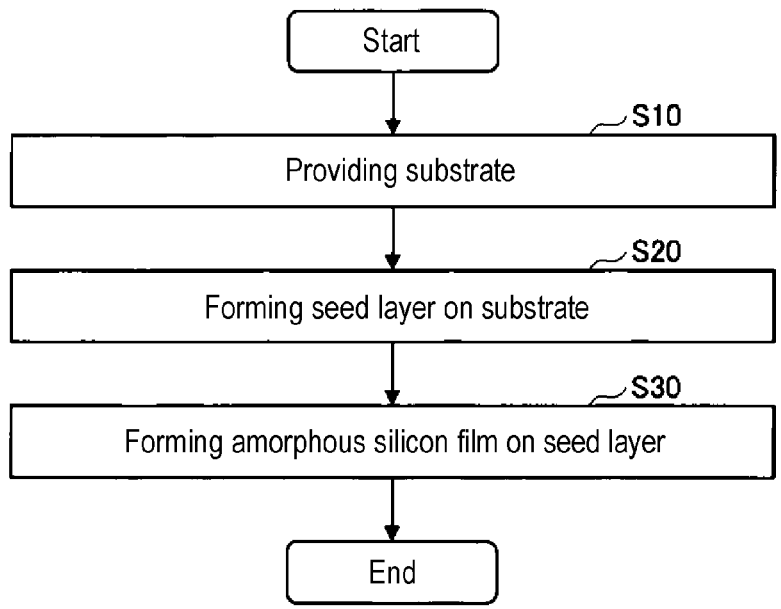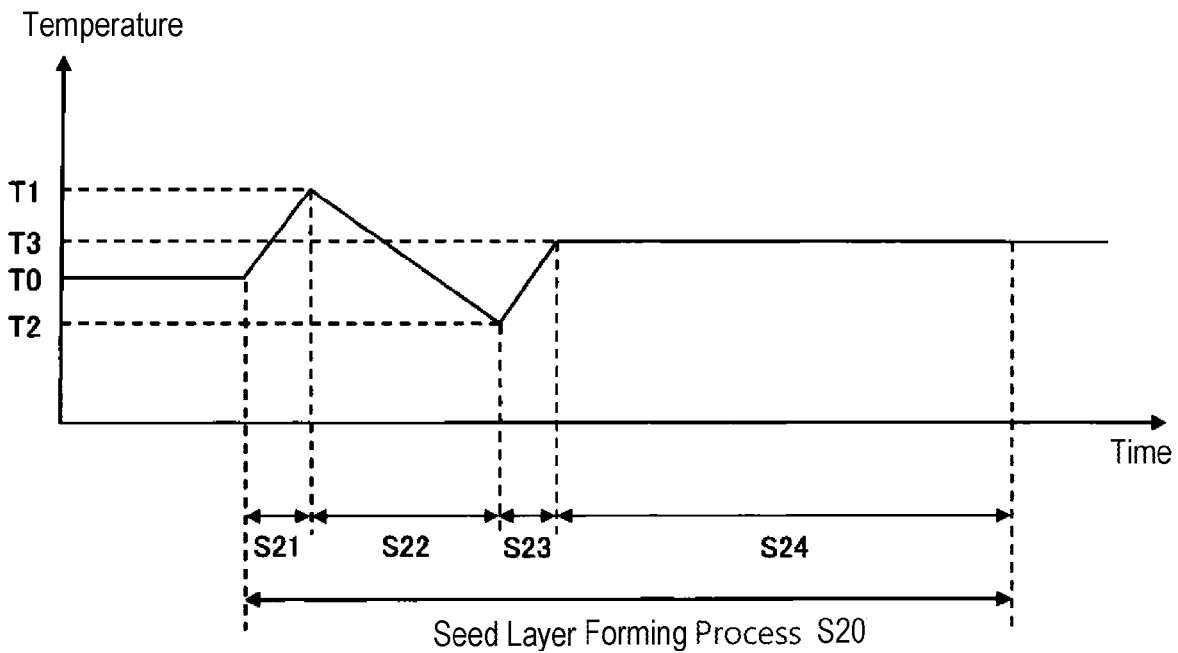

FILM FORMING METHOD AND FILM FORMING APPARATUS

CROSS-REFERENCE TO RELATED APPLICATION

This application is based upon and claims the benefit of priority from Japanese Patent Application No. 2019-064843, filed on Mar. 28, 2019, the entire contents of which are incorporated herein by reference.

TECHNICAL FIELD

The present disclosure relates to a film forming method and a film forming apparatus.

BACKGROUND

There is known a technology for forming a silicon film by supplying a silane-based gas and a silicon-based chlorine-containing compound gas to a substrate having a fine recess formed on the surface thereof (see, for example, Patent Document 1).

PRIOR ART DOCUMENT

Patent Document

Patent Document 1: Japanese Laid-Open Patent Publication No. 2017-152426

SUMMARY

According to one embodiment of the present disclosure, there is provided a film forming method including: supplying a halogen-free silicon raw material gas and a halogen-containing silicon raw material gas into a processing container while lowering a temperature of a substrate accommodated in the processing container from a first temperature to a second temperature in a temperature lowering process; and supplying the halogen-free silicon raw material gas and the halogen-containing silicon raw material gas into the processing container while maintaining the temperature of the substrate at a third temperature in a temperature stabilizing process, that occurs after the temperature lowering process.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a flowchart illustrating a film forming method according to an embodiment.

FIG. 2 is a diagram showing an example of temperature control in a step of forming a seed layer.

DETAILED DESCRIPTION

Figure 3:
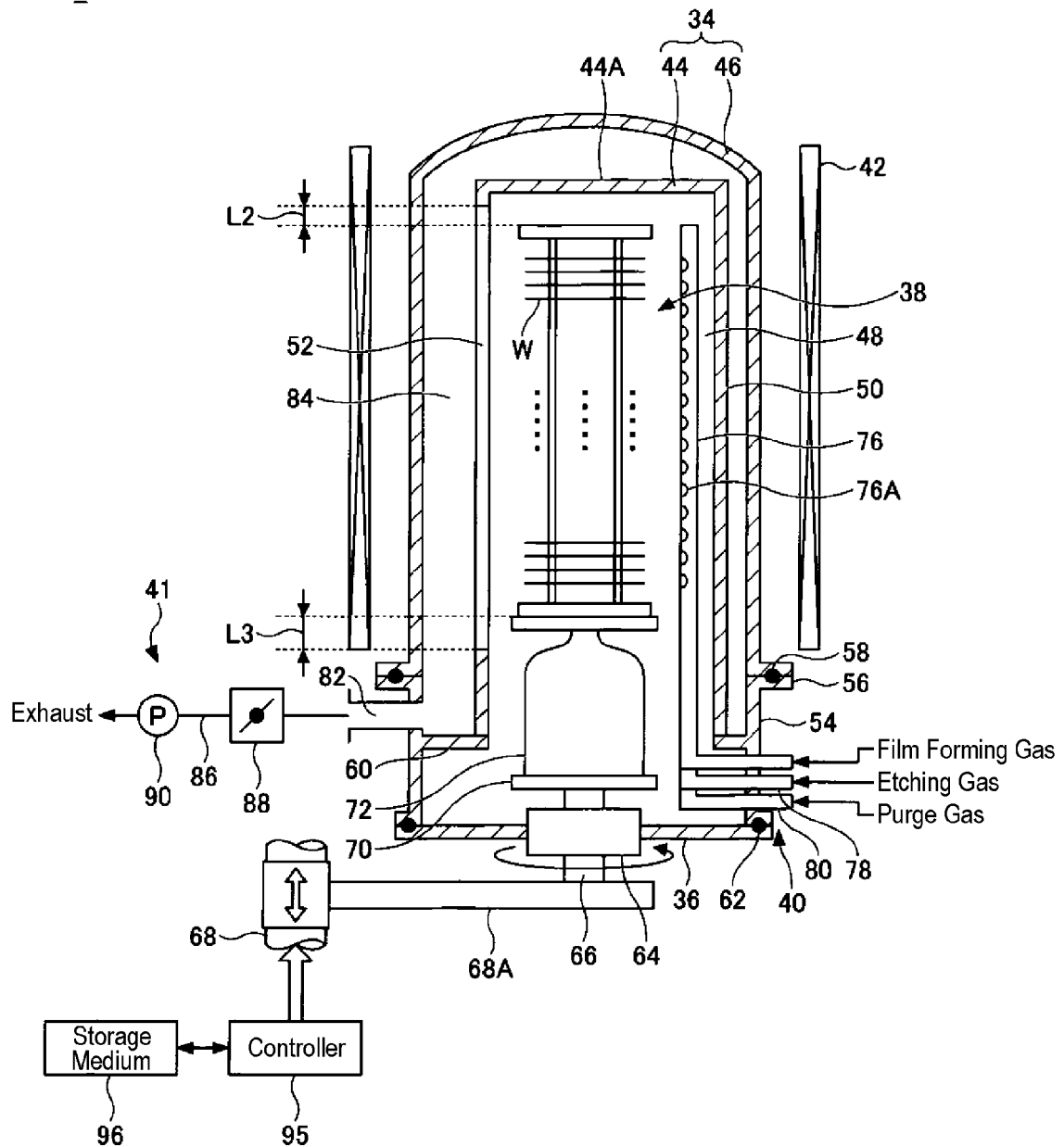
FIG. 3 is a vertical cross-sectional view illustrating an exemplary configuration of a vertical heat treatment apparatus.

Hereinafter, non-limitative exemplary embodiments of the present disclosure will now be described with reference to the accompanying drawings. In all the accompanying drawings, the same or corresponding members or components will be denoted by the same or corresponding reference numerals, and redundant explanations thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

(Film Forming Method)

A film forming method according to an embodiment will be described. FIG. 1 is a flowchart illustrating the film forming method according to an embodiment.

As illustrated in FIG. 1, the film forming method of an embodiment includes a step S10 of providing a substrate, a step S20 of forming a seed layer on the substrate, and a step S30 of forming an amorphous silicon film on the seed layer. Each step will be described below.

(Step S10 of Providing Substrate)

In Step S10 of providing a substrate, the substrate on which an amorphous silicon film is to be formed is provided. The substrate may be a substrate having a smooth surface or a substrate having a recess, such as a trench or a hole, formed on the surface thereof. The substrate may be, for example, a semiconductor substrate such as a silicon substrate. In addition, an insulating film, such as a silicon oxide film ($SiO_2$ film), a silicon nitride film (SiN film) or the like, may be formed on the surface of the substrate.

(Step S20 of Forming Seed Layer)

In step S20 of forming a seed layer, a silicon raw material gas for a seed layer is supplied to the substrate so as to form the seed layer on the substrate. FIG. 2 is a view illustrating an example of temperature control in the seed layer forming step S20. In FIG. 2, the horizontal axis represents time, and the vertical axis represents a set temperature. As represented in FIG. 2, the seed layer forming step S20 includes a first temperature raising step S21, a temperature lowering step S22, a second temperature raising step S23, and a temperature stabilizing step S24.

The first temperature raising step S21 is a step of raising the temperature of the substrate accommodated in a pressure-reducible processing container from an initial temperature T0 to a first temperature T1. The first temperature raising step S21 is performed, for example, in the state in which vacuum is formed inside the processing container by a vacuum pump or the like. In addition, the first temperature raising step S21 may be performed, for example, while supplying an inert gas or a hydrogen gas into the processing container. The first temperature T1 is a temperature higher than the initial temperature T0. The initial temperature T0 and the first temperature T1 are determined depending on the types of a halogen-free silicon raw material gas and a halogen-containing silicon raw material gas to be supplied into the processing container in the temperature lowering step S22 and the temperature stabilizing step S24, which will be described later. The first temperature raising step S21 may be a temperature stabilizing step. In this case, the initial temperature T0 may be set to the first temperature T1.

The temperature lowering step S22 is a step of supplying the halogen-free silicon raw material gas and the halogen-containing silicon raw material gas into the processing container while lowering the temperature of the substrate accommodated in the pressure-reducible processing container from the first temperature T1 to the second temperature T2. The purpose of this step is as follows. In a case where the temperatures of the central portion and the peripheral portion of the substrate are substantially the same when the halogen-free silicon raw material gas and the halogen-containing silicon raw material gas are supplied, nucleation progresses rapidly in the peripheral portion of the substrate having a high concentration of the raw material gas, thus variations occur in the progress of nucleation in the plane of the substrate. By lowering the temperature, the in-plane temperature of the substrate may be set to be higher in the central portion than in the peripheral portion. It is therefore possible to make the progress of nucleation uniform in the plane. The temperature lowering step S22 is a step performed at the beginning of the seed layer forming step S20, and is performed prior to the temperature stabilizing step S24.

In the temperature lowering step S22, the supply of the halogen-free silicon raw material gas and the halogen-containing silicon raw material gas into the processing container begins, for example, from the half-way point of temperature reduction from the first temperature T1 to the second temperature T2. Thus, the supply of the raw material gas is begins after a temperature difference occurs between the central portion and the peripheral portion of the substrate. Thus, it is possible to efficiently make the progress of nucleation uniform at the central portion and the peripheral portion of the substrate.

In the temperature lowering step S22, the supply of the halogen-free silicon raw material gas and the halogen-containing silicon raw material gas into the processing container may begin simultaneously with starting the temperature reduction from the first temperature T1 to the second temperature T2.

The second temperature T2 is, for example, a temperature lower than the initial temperature T0 and the first temperature T1. However, the second temperature T2 may be lower than the first temperature T1, and may be, for example, a temperature equal to or higher than the initial temperature T0. The second temperature T2 is determined depending on the types of the halogen-free silicon raw material gas and the halogen-containing silicon raw material gas.

A duration of the temperature lowering step S22 may be the same or substantially the same as an incubation time of a silicon film on the substrate. The incubation time refers to a nucleation time from the start of the supply of the halogen-free silicon raw material gas and the halogen-containing silicon raw material gas until the start of the actual film formation on the substrate. In a case where an insulating film is formed on the surface of the substrate, the duration of the temperature lowering step S22 may be the same or substantially the same as the incubation time of the silicon film on the insulating film. In addition, the duration of the temperature lowering step S22 is set to be shorter than, for example, that of the temperature stabilizing step S24. However, the duration of the temperature lowering step S22 may be set to be longer than that of the temperature stabilizing step S24.

As the halogen-free silicon raw material gas, for example, an aminosilane-based gas or a hydrogenated silicon gas may be used. As the aminosilane-based gas, for example, diisopropylamino silane (DIPAS), trisdimethylamino silane (3DMAS), or bis (tertiary-butylamino) silane (BTBAS) may be used. As the hydrogenated silicon gas, for example, $SiH_4$, $Si_2H_6$, $Si_3H_8$ or $Si_4H_{10}$ may be used.

As the halogen-containing silicon raw material gas, for example, a fluorine-containing silicon gas, a chlorine-containing silicon gas, or a bromine-containing silicon gas may be used. As the fluorine-containing silicon gas, for example, $SiF_4$, $SiHF_3$, $SiH_2F_2$, or $SiH_3F$ may be used. As the chlorine-containing silicon gas, for example, $SiCl_4$, $SiHCl_3$, $SiH_2Cl_2$ (DCS), $SiH_3Cl$, or $Si_2Cl_6$ may be used. As the bromine-containing silicon gas, for example, $SiBr_4$, $SiHBr_3$, $SiH_2Br_2$, or $SiH_3Br$ may be used.

The second temperature raising step S23 is a step of raising the temperature of the substrate accommodated in the pressure-reducible processing container from the second temperature T2 to a third temperature T3. The second temperature raising step S23 is performed, for example, in the state in which a hydrogen gas is supplied into the processing container. The second temperature raising step S23 may be performed, for example, in the state in which vacuum is formed inside the processing container by the vacuum pump or the like, or may be performed while supplying the inert gas into the processing container. The third temperature T3 is determined depending on the types of the halogen-free silicon raw material gas and the halogen-containing silicon raw material gas. The third temperature T3 may be, for example, a temperature equal to or higher than the second temperature T2 and equal to or lower than the first temperature T1. However, the present disclosure is not limited thereto. The third temperature T3 may be a temperature equal to or lower than the second temperature T2 or equal to or higher than the first temperature T1.

The temperature stabilizing step S24 is a step of supplying the halogen-free silicon raw material gas and the halogen-containing silicon raw material gas into the processing container while maintaining the temperature of the substrate accommodated in the pressure-reducible processing container at the third temperature T3. As the halogen-free silicon raw material gas and the halogen-containing silicon raw material gas, for example, the same gases as those used in the temperature lowering step S22 may be used.

In the case where the $SiH_4$ gas is used as the halogen-free silicon raw material gas and the DCS gas is used as the halogen-containing silicon raw material gas, appropriate temperature ranges of the initial temperature T0, the first temperature T1, the second temperature T2, and the third temperature T3 are as follows. On the basis of the center temperature, it is determined depending on the supply amounts and the supply amount ratio of respective raw material gases, or an internal pressure of the processing container.

Initial temperature T0: 400-500 degrees C. (center temperature: 450 degrees C.)

First temperature T1: 430 to 530 degrees C. (center temperature: 480 degrees C.)

Second temperature T2: 390 to 490 degrees C. (center temperature: 440 degrees C.)

Third temperature T3: 420 to 520 degrees C. (center temperature: 470 degrees C.)

(Step S30 of Forming Amorphous Silicon Film)

In the amorphous silicon film forming step S30, a silicon raw material gas is supplied to the substrate so as to form an amorphous silicon film on the seed layer. In an embodiment, the amorphous silicon film is formed on the seed layer in a conformal manner by supplying the silicon raw material gas through, for example, a chemical vapor deposition (CVD) method in the state in which the substrate is heated to a predetermined temperature (e.g., 400 to 550 degrees C.). The amorphous silicon film may be a non-doped silicon film, and may be a silicon film doped with impurity. The impurity may be, for example, boron (B), phosphorus (P), arsenic (As), oxygen (O), or carbon (C).

As the silicon raw material gas, any gas applicable to the CVD method may be used. For example, one or more of a silicon hydride gas, a halogen-containing silicon gas, and an aminosilane-based gas may be used in combination. In the case of doping an impurity, as the impurity-containing gas, for example, $B_2H_6$, $BCl_3$, $PH_3$, or $AsH_3$ may be used.

In a case where a film is formed by supplying a halogen-free silicon raw material gas and a halogen-containing silicon raw material gas into the processing container in the state in which the temperatures in the plane of the substrate are substantially the same, the film thickness becomes thicker in the peripheral portion of the substrate compared to the central portion of the substrate. The following are conceivable factors for such a film formation distribution. The first is a difference in incubation time, and the second is a difference in progress of film formation (difference in film formation rate). As a result of intensive studies, it has been found that the main factor is the difference in incubation time. In particular, in the case of a substrate having a recess (a concave pattern) such as a hole or trench formed on the surface thereof, that is, a substrate having a large surface area, the difference in incubation time in the plane of the substrate becomes large. In the region where the incubation time is short, the time required until film formation begins on the substrate is shorter than that in the region where the incubation time is long, and thus the film thickness is large. Therefore, the in-plane uniformity of the film thickness deteriorates.

Therefore, in the film forming method of an embodiment, in the seed layer forming step S20, the temperature lowering step S22 is performed at the early stage of film formation, and the temperature stabilizing step S24 is performed after the temperature lowering step S22. The temperature lowering step S22 is a step of supplying the halogen-free silicon raw material gas and the halogen-containing silicon raw material gas into the processing container while lowering the temperature of the substrate accommodated in the processing container from the first temperature T1 to the second temperature T2. The temperature stabilizing step S24 is a step of supplying the halogen-free silicon raw material gas and the halogen-containing silicon raw material gas into the processing container while maintaining the temperature of the substrate at the third temperature T3. This reduces the difference in incubation time, which is the main factor in deteriorating the in-plane uniformity. Thereafter, a film formation rate is secured so as to perform the film formation.

In the film forming method of an embodiment, in the seed layer forming step S20, the temperature lowering step S22 is performed only at the early stage of the film formation. This makes it possible to suppress a deterioration in productivity and to improve the in-plane uniformity of the film thickness.

[Film Forming Apparatus]

A film forming apparatus capable of performing the above-described film formation method will be described by taking as an example a batch-type vertical heat treatment apparatus that performs heat treatment on a large number of substrates at once. However, the film forming apparatus is not limited to the batch-type apparatus, and may be, for example, a single-wafer-type apparatus that processes substrates one by one.

Figure 4:
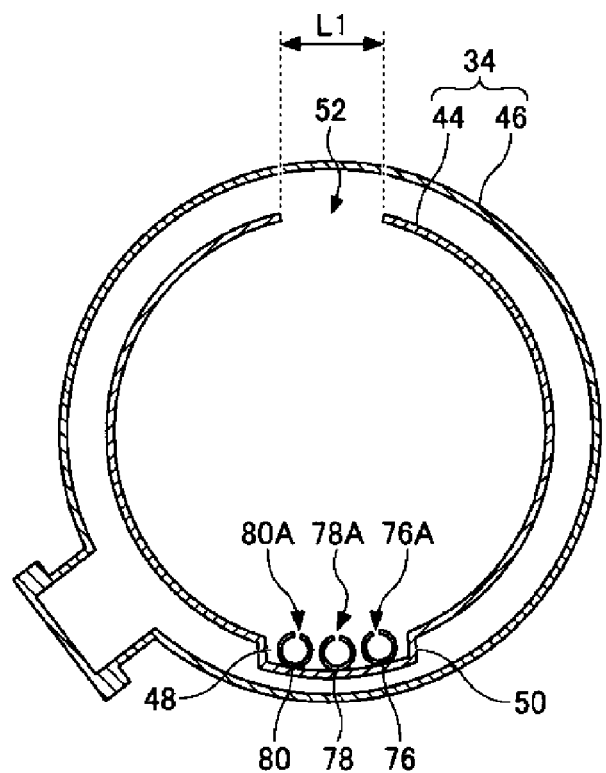
FIG. 4 is a view for explaining a processing container of the vertical heat treatment apparatus of FIG. 3.

FIG. 3 is a vertical cross-sectional view illustrating an exemplary configuration of the vertical heat treatment apparatus. FIG. 4 is a view for explaining a processing container of the vertical heat treatment apparatus of FIG. 3.

As illustrated in FIG. 3, a vertical heat treatment apparatus 1 includes a processing container 34, a lid 36, a wafer boat 38, a gas supply part 40, an exhaust part 41, and a heating part 42.

The processing container 34 accommodates the wafer boat 38. The wafer boat 38 is a substrate holder that holds a large number of semiconductor wafers (hereinafter, referred to as "wafers W") at a predetermined interval in the vertical direction in a shelf-like manner. The processing container 34 has a cylindrical inner tube 44 having a ceiling and a lower opened end, and a cylindrical outer tube 46 having a ceiling and a lower opened end and covering the outside of the inner tube 44. The inner tube 44 and the outer tube 46 are formed of a heat-resistant material such as quartz, and are arranged in a coaxial relationship with each other to have a double-tube structure.

A ceiling 44A of the inner tube 44 is, for example, flat. At one side of the inner tube 44, a nozzle accommodation portion 48 in which gas supply pipes are accommodated is formed in the longitudinal direction thereof (the vertical direction). For example, as illustrated in FIG. 4, a portion of the sidewall of the inner tube 44 protrudes outward so as to form a convex portion 50. The interior of the convex portion 50 is defined as the nozzle accommodation portion 48. In the sidewall of the inner tube 44 opposite the nozzle accommodation portion 48, a rectangular opening 52 having a width L1 is provided in the longitudinal direction thereof (the vertical direction).

The opening 52 is a gas exhaust port formed so as to be capable of exhausting the gas in the inner tube 44. A length of the opening 52 is equal to that of the wafer boat 38 or extend upward and downward in the vertical direction to be longer than the length of the wafer boat 38. That is, an upper end of the opening 52 extends such that it is located at a height equal to or higher than a position corresponding to an upper end of the wafer boat 38, and a lower end of the opening 52 extends such that it is located at a height equal to or lower than a position corresponding to a lower end of the wafer boat 38. Specifically, as illustrated in FIG. 3, a distance L2 in the height direction between the upper end of the wafer boat 38 and the upper end of the opening 52 falls within a range of about 0 mm to 5 mm. A distance L3 in the height direction between the lower end of the wafer boat 38 and the lower end of the opening 52 falls within a range of about 0 mm to 350 mm.

A lower end of the processing container 34 is supported by a cylindrical manifold 54 formed of, for example, stainless steel. A flange 56 is formed on an upper end of the manifold 54. The lower end of the outer tube 46 is installed and supported on the flange 56. A seal member 58 such as an O-ring is interposed between the flange 56 and the lower end of the outer tube 46 such that the interior of the outer tube 46 is hermetically sealed.

An annular support portion 60 is provided on an inner wall of an upper portion of the manifold 54. The lower end of the inner tube 44 is installed and supported on the support portion 60. The lid 36 is hermetically installed to a lower end opening of the manifold 54 via a sealing member 62 such as an O-ring so as to hermetically close a lower end opening of the processing container 34, that is, the opening of the manifold 54. The lid 36 is formed of, for example, stainless steel.

In the central portion of the lid 36, a rotary shaft 66 is provided through a magnetic fluid seal 64. A lower portion of the rotary shaft 66 is rotatably supported by an arm 68A of an elevating part 68 including a boat elevator.

A rotary plate 70 is provided at an upper end of the rotary shaft 66. The wafer boat 38 that holds the wafers W is placed on the rotary plate 70 via a quartz heat-insulating base 72. Accordingly, by moving the elevating part 68 up and down, the lid 36 and the wafer boat 38 move vertically as a unit, so that the wafer boat 38 can be inserted into and removed from the processing container 34.

The gas supply part 40 is provided in the manifold 54, and introduces gases such as a film-forming gas, an etching gas, and a purge gas into the inner tube 44. The gas supply part 40 has a plurality of (e.g., three) gas supply pipes 76, 78, and 80 made of quartz. Each of the gas supply pipes 76, 78, and 80 is provided within the inner tube 44 in the longitudinal direction thereof. A base end of each gas supply pipe is bent in an L shape and penetrates the manifold 54 while being supported by the manifold 54.

As illustrated in FIG. 4, the gas supply pipes 76, 78, and 80 are installed in the nozzle accommodation portion 48 of the inner tube 44 in a row in the circumferential direction. Each gas supply pipe 76, 78, or 80 has a plurality of gas holes 76A, 78A, or 80A formed at a predetermined interval in the longitudinal direction. Gases are discharged from the gas holes 76A, 78A, or 80A in the horizontal direction. Thus, the gases are supplied from the peripheries of the wafers W substantially parallel to the main surfaces of the wafers W. The predetermined interval may be set to be equal to the interval between the wafers W supported in the wafer boat 38. The positions in the height direction are set such that each of the gas holes 76A, 78A, and 80A is located in the middle between vertically adjacent wafers W, so that each gas can be efficiently supplied to spaces between the wafers W. As the types of gases, a film-forming gas, an etching gas, and a purge gas are used. The gases can be supplied through the respective gas supply pies 76, 78, and 80, as necessary, while the flow rates thereof are controlled. Example of the film-forming gas may include the halogen-free silicon raw material gas and the halogen-containing silicon raw material gas described above.

A gas outlet 82 is formed in an upper sidewall of the manifold 54 above the support portion 60, so that the gas in the inner tube 44, which is exhausted from the opening 52, can be exhausted through a space portion 84 between the inner tube 44 and the outer tube 46. In the gas outlet 82, an exhaust part 41 is provided. The exhaust part 41 has an exhaust passage 86 connected to the gas outlet 82. A pressure regulation valve 88 and a vacuum pump 90 are sequentially provided in the exhaust passage 86, so that the interior of the processing container 34 can be evacuated.

On the outer circumferential side of the outer tube 46, a cylindrical heating part 42 is provided so as to cover the outer tube 46. The heating part 42 heats the wafers W accommodated in the processing container 34.

The overall operation of the vertical heat treatment apparatus 1 is controlled by a controller 95. The controller 95 may be, for example, a computer. A computer program that causes the overall operation of the vertical heat treatment apparatus 1 to be performed is stored in a non-transient storage medium 96. For example, the storage medium 96 may be a flexible disc, a compact disc, a hard disc, flash memory, a DVD or the like.

An example of the film forming method of forming an amorphous silicon film on each wafer W using the vertical heat treatment apparatus 1 will be described. First, the wafer boat 38 holding the large number of wafers W is loaded into the processing container 34 by the elevating part 68. The lower end opening of the processing container 34 is hermetically closed and sealed by the lid 36. Subsequently, the operations of the gas supply part 40, the exhaust part 41, the heating part 42, and the like are controlled by the controller 95 so as to execute the above-described film forming method. Thus, the amorphous silicon film is formed on each wafer W.

In the case where the halogen-free silicon raw material gas and the halogen-containing silicon raw material gas are supplied from the peripheries of the wafers W substantially in parallel with the main surfaces of the wafers W, the film thickness in the peripheral portion of each wafer is prone to be larger than the film thickness in the central portion of each wafer. In particular, when the large number of wafers W are held at a predetermined interval in the vertical direction in the shelf-like manner, a difference in film thickness occurring between the central portion and the peripheral portion of each wafer increases as the interval decreases. Therefore, in order to reduce the difference in film thickness occurring between the central portion and the peripheral portion of each wafer, a method of increasing the interval is conceivable. However, if the interval is increased, the number of wafers W that are capable of being accommodated in the processing container decreases, which deteriorates productivity.

Therefore, in the film forming method of an embodiment, in the seed layer forming step S20, the temperature lowering step S22 is performed at the early stage of film formation, and the temperature stabilizing step S24 is performed after the temperature lowering step S22. As a result, the difference in incubation time in the plane of each wafer W is reduced, and the in-plane uniformity of the thickness of the amorphous silicon film formed on each wafer W is improved. Thus, it is possible to improve the in-plane uniformity of the thickness of the amorphous silicon film without increasing the interval. In other words, it is possible to improve the in-plane uniformity of the thickness of the amorphous silicon film without deteriorating productivity.

EXAMPLES

Next, examples performed to confirm the effects of the film forming method of an embodiment will be described.

Figure 5:
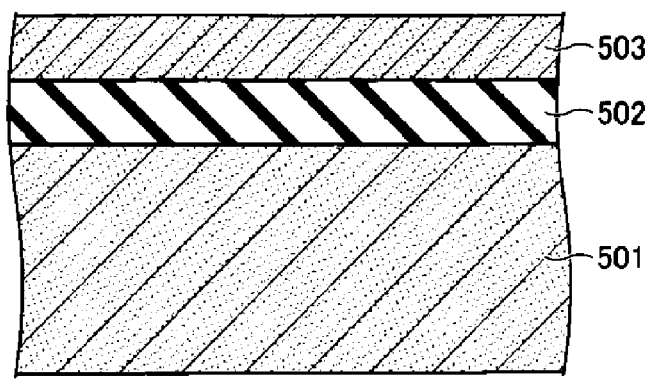
FIG. 5 is a view for explaining evaluation samples of Example 1 and Comparative Example 1.

In Example 1, a plurality of amorphous silicon films 503 having different thicknesses were formed by performing the above-described seed layer forming step S20 on silicon wafers 501, each having a smooth surface and a $SiO_2$ film 502 formed on the surface (see FIG. 5). The above-described vertical heat treatment apparatus 1 was used as the film forming apparatus. Processing conditions used in the seed layer forming step S20 were as follows.

Initial temperature T0: 450 degrees C.
First temperature T1: 480 degrees C.
Second temperature T2: 440 degrees C.
Third temperature T3: 470 degrees C.
Halogen-free silicon raw material gas: $SiH_4$ gas Halogen-containing silicon raw material gas: DCS gas For comparison with Example 1, a plurality of amorphous silicon films 503 having different thicknesses were formed on silicon wafers 501 similar to those in Example 1 while keeping the wafer temperature constant (at 470 degrees C.) (Comparative Example 1). Processing conditions other than the wafer temperature in Comparative Example 1 are the same as the processing conditions in Example 1.

Next, the film thickness distribution in the plane of each wafer was measured for the amorphous silicon films 503 formed in Example 1 and Comparative Example 1.

Figure 6:
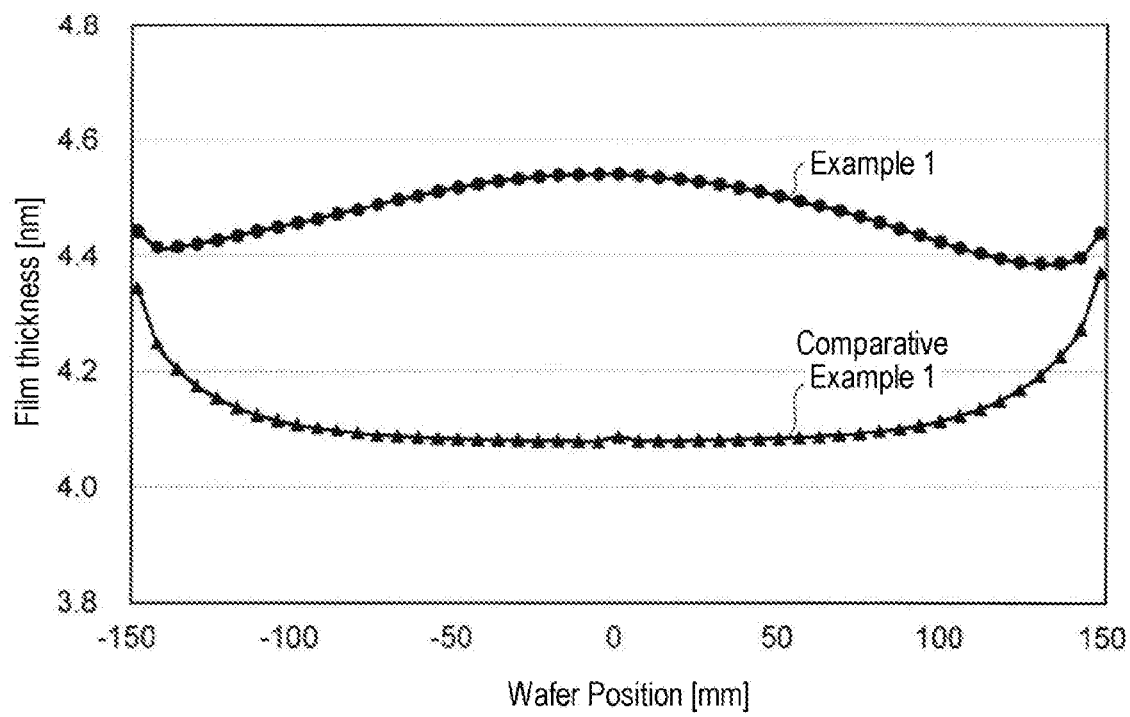
FIG. 6 is a diagram showing measurement results of in-plane distributions of film thicknesses.

FIG. 6 is a diagram showing measurement results of in-plane distributions of film thicknesses. In FIG. 6, the horizontal axis represents a wafer position [mm], and the vertical axis represents a thickness [nm] of the amorphous silicon film 503. In FIG. 6, circle (●) marks indicate the measurement results of Example 1, and triangle (▲) marks indicate the measurement results of Comparative Example 1. The wafer position of 0 mm indicates the center of the wafer, and the wafer positions of −150 mm and +150 mm each indicate ends of the wafer.

As represented in FIG. 6, in Comparative Example 1, the film thickness in the peripheral portion of each wafer is larger than the film thickness in the central portion of the wafer. In contrast, in Example 1, as compared with Comparative Example 1, the film thickness in the central portion of the wafer becomes larger, and the difference in film thickness between the central portion and the peripheral portion of the wafer becomes smaller. Specifically, the in-plane uniformity of the film thickness was ±1.7% in Example 1, whereas the in-plane uniformity of the film thickness was ±3.6% in Comparative Example 1. From these results, it can be said that the film forming method according to Example 1 is capable of improving the in-plane uniformity of the film thickness as compared with the film forming method according to Comparative Example 1.

Subsequently, by measuring the film thicknesses of the plurality of amorphous silicon films 503 formed in Example 1 and Comparative Example 1 in the central portions and the peripheral portions of the wafers, the incubation times in the central portions and the peripheral portions of the wafers were calculated.

Figure 7:
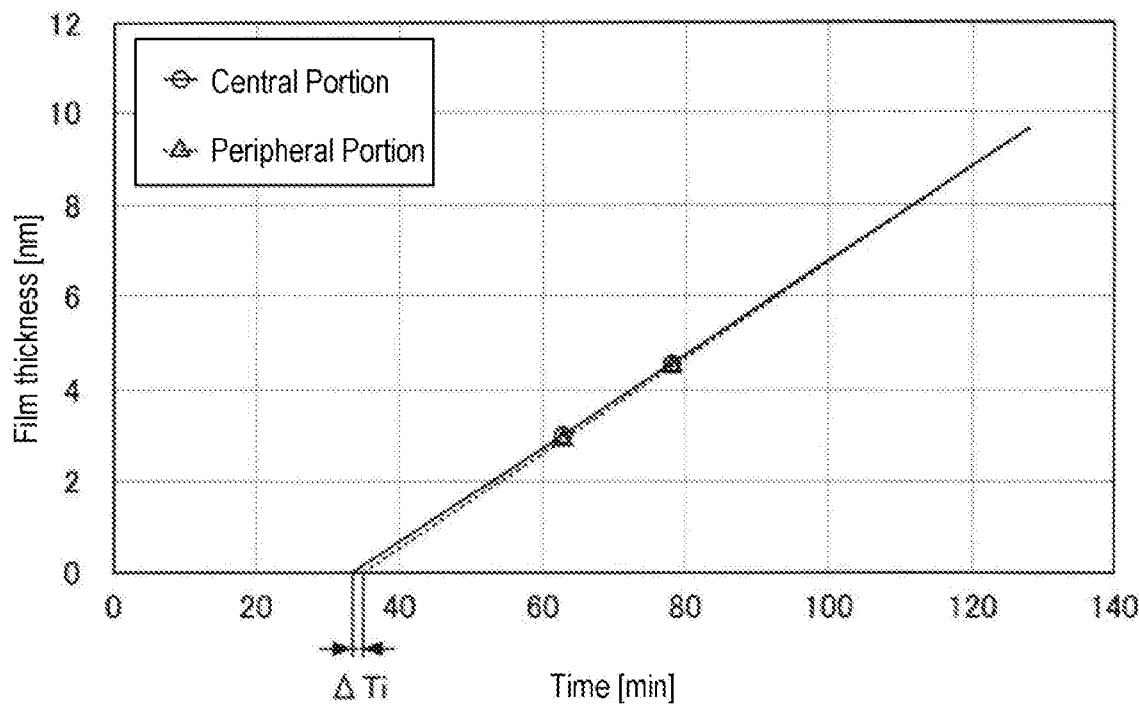
FIG. 7 is a diagram showing evaluation results of Example 1.
Figure 8:
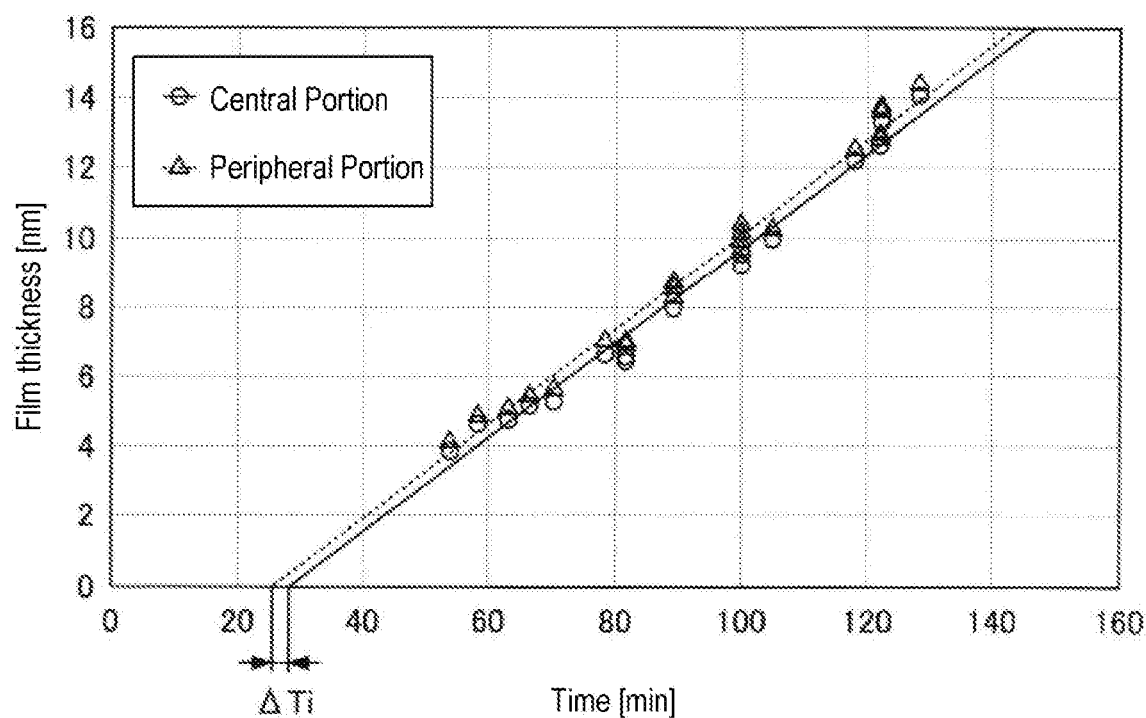
FIG. 8 is a diagram showing evaluation results of Comparative Example 1.

FIG. 7 is a diagram showing the evaluation results of Example 1. FIG. 8 is a diagram showing evaluation results of Comparative Example 1. In each of FIGS. 7 and 8, the horizontal axis represents a processing time [min] of the seed layer forming step S20, and the vertical axis represents a thickness [nm] of the amorphous silicon film 503. In FIGS. 7 and 8, the measurement results in the central portion of each wafer are indicated by circle (○) marks, and the measurement results in the peripheral portion of each wafer are indicated by triangle (△) marks.

As illustrated in FIG. 7, in Example 1, the difference in incubation time ΔTi between the central portion and the peripheral portion of the wafer was 1.5 min. Meanwhile, as shown in FIG. 8, in Comparative Example 1, the difference in incubation time ΔTi between the central portion and the peripheral portion of the wafer was 2.8 min. That is, it can be seen that the difference in incubation time ΔTi is smaller in the film forming method according to Example 1 than in the film forming method according to Comparative Example 1. In addition, the incubation time in Comparative Example 1 is short in the peripheral portion of the wafer, whereas the incubation time in Example 1 is short in the central portion of the wafer. From this, it can be seen that the difference in incubation time is capable of being controlled by supplying the halogen-free silicon raw material gas and the halogen-containing silicon raw material gas while lowering the temperature in the temperature lowering step S22 in the initial stage of film formation. In addition, it can be seen that the film formation rate (the slope of the graph) is the same in the central portion and the peripheral portion of the wafer.

From the results of Example 1 and Comparative Example 1, it can be said that in the seed layer forming step S20, by performing the temperature lowering step S22 and the temperature stabilizing step S24 in this order, it is possible to reduce the difference in incubation time ΔTi in the plane of the wafer. As a result, it can be said that it is possible to efficiently improve the in-plane uniformity of the film thickness when forming the amorphous silicon film on the substrate having a smooth surface.

Figure 9:
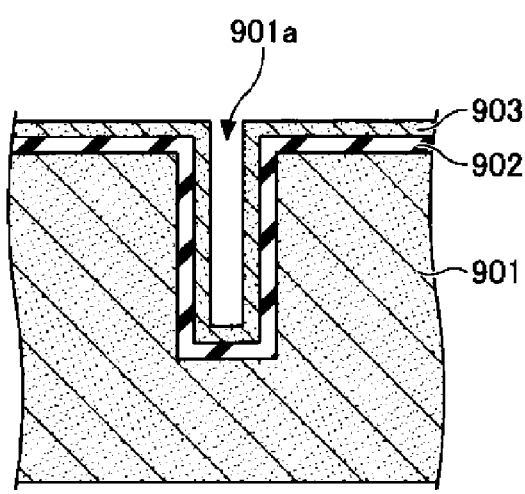
FIG. 9 is a view for explaining evaluation samples of Example 2 and Comparative Example 2.

In Example 2, an amorphous silicon film 903 was formed by performing the aforementioned seed layer forming step S20 on a silicon wafer 901 having a recess 901a formed in a surface thereof and a SiO$_2$ film 902 formed on a surface of the recess 901a (see FIG. 9). The above-described vertical heat treatment apparatus 1 was used as the film forming apparatus. Processing conditions used in the seed layer forming step S20 are the same as in Example 1.

For comparison with Example 2, the amorphous silicon film 903 was formed on the silicon wafer 901 which is similar to that in Example 2 while keeping the temperature of the wafer constant (at 470 degrees C.) (Comparative Example 2). Processing conditions other than the wafer temperature in Comparative Example 2 are the same as the processing conditions in Example 2.

Next, the film thickness distribution in the plane of each wafer was measured for the amorphous silicon films 903 formed in Example 2 and Comparative Example 2.

Figure 10:
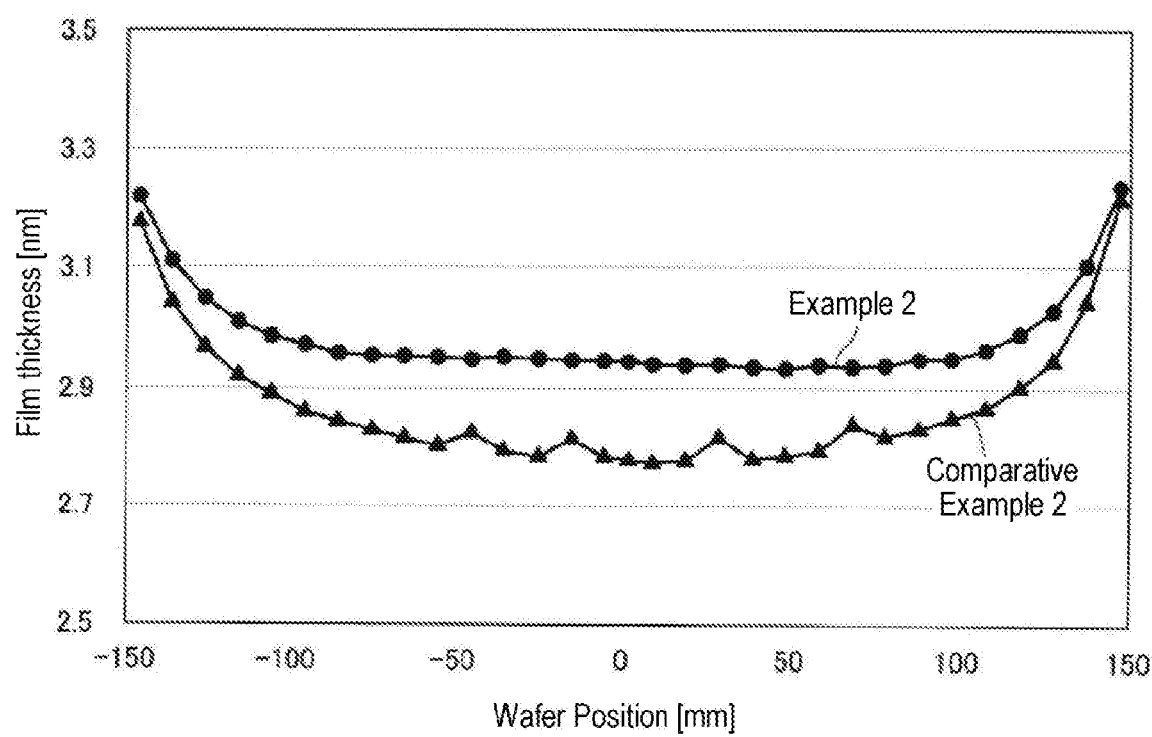
FIG. 10 is a diagram showing measurement results of in-plane distributions of film thicknesses.

FIG. 10 is a diagram showing measurement results of in-plane distributions of film thicknesses. In FIG. 10, the horizontal axis represents a wafer position [mm], and the vertical axis represents a thickness [mm] of the amorphous silicon film 903. In FIG. 10, circle (●) marks indicate the measurement results of Example 2, and triangle (▲) marks indicate the measurement results of Comparative Example 2. The wafer position of 0 mm indicates the center of the wafer, and the wafer positions of −150 mm and +150 mm each indicate ends of the wafer.

As shown in FIG. 10, in both Example 2 and Comparative Example 2, the thickness in the peripheral portion of each wafer becomes larger than the thickness in the central portion of the wafer. In Example 2, the difference in film thickness between the central portion and the peripheral portion of the wafer becomes smaller compared to Comparative Example 2. Specifically, the in-plane uniformity of the film thickness in Example 2 was ±5.1%, whereas the in-plane uniformity of the film thickness in Comparative Example 2 was ±7.8%. From these results, it can be said that the film forming method according to Example 2 is capable of improving the in-plane uniformity of the film thickness as compared with the film forming method according to Comparative Example 2.

It should be noted that the embodiments disclosed herein are exemplary in all respects and are not restrictive. The above-described embodiments may be omitted, replaced or modified in various forms without departing from the scope and spirit of the appended claims.

In the above-described embodiments, the case where the substrate is a semiconductor wafer has been described as an example, but the present disclosure is not limited thereto. For example, the substrate may be a large substrate for a flat panel display (FPD), or a substrate for an EL element or a solar cell.

According to the present disclosure in some embodiments, it is possible to improve in-plane uniformity of a film thickness.

What is claimed is:

1. A film forming method comprising:
forming a film by supplying a halogen-free silicon raw material gas and a halogen-containing silicon raw material gas into a processing container,
wherein the forming the film includes:
   a temperature lowering process of lowering a temperature of a substrate accommodated in the processing container from a first temperature to a second temperature while supplying the halogen-free silicon raw material gas and the halogen-containing silicon raw material gas into the processing container; and
   a temperature stabilizing process of maintaining the temperature of the substrate at a third temperature while supplying the halogen-free silicon raw material gas and the halogen-containing silicon raw material gas into the processing container, wherein the temperature stabilizing process occurs after the temperature lowering process.

2. The film forming method of claim 1, wherein the halogen-free silicon raw material gas and the halogen-containing silicon raw material gas are supplied from a periphery of the substrate.

3. The film forming method of claim 1, wherein the halogen-free silicon raw material gas and the halogen-containing silicon raw material gas are supplied parallel to a main surface of the substrate.

4. The film forming method of claim 1, wherein, in the temperature lowering process, the halogen-free silicon raw material gas and the halogen-containing silicon raw material gas are supplied into the processing container from a halfway point of a temperature reduction.

5. The film forming method of claim 1, wherein, in the temperature lowering process, the halogen-free silicon raw material gas and the halogen-containing silicon raw material gas begins to be supplied into the processing container simultaneously with the start of a temperature reduction.

6. The film forming method of claim 1, wherein the third temperature is equal to or higher than the second temperature and equal to or lower than the first temperature.

7. The film forming method of claim 1, wherein a period of time of the temperature lowering process is shorter than that of the temperature stabilizing process.

8. The film forming method of claim 1, wherein the substrate has a recess formed in a surface thereof.

9. The film forming method of claim 1, wherein a plurality of substrates are accommodated in the processing container at a predetermined interval in a vertical direction in a shelf-like manner.

* * * * *